US008187405B2

(12) United States Patent
Woods et al.

(10) Patent No.: US 8,187,405 B2

(45) Date of Patent: May 29, 2012

(54) MANUFACTURE OF SONAR PROJECTORS

(75) Inventors: Michael Edward Woods, Worthing (GB); Jonathan Michael George Penny, Portsmouth (GB)

(73) Assignee: Bae Systems PLC, London (GB)

( * ) Notice: Subject to any disclaimer, the term of this patent is extended or adjusted under 35 U.S.C. 154(b) by 126 days.

(21) Appl. No.: 12/297,563

(22) PCT Filed: Sep. 2, 2008

(86) PCT No.: PCT/GB2008/050767

§ 371 (c)(1), (2), (4) Date: Oct. 17, 2008

(87) PCT Pub. No.: WO2009/034371

PCT Pub. Date: Mar. 19, 2009

(65) Prior Publication Data

US 2010/0170617 A1 Jul. 8, 2010

(30) Foreign Application Priority Data

Sep. 12, 2007 (EP) .................................... 07270047
Sep. 12, 2007 (GB) .................................. 0717713.2

(51) Int. Cl.
*H01L 41/24* (2006.01)
*B32B 38/00* (2006.01)

(52) U.S. Cl. ......... 156/221; 156/268; 156/153; 310/311

(58) Field of Classification Search ................ 156/73.6, 156/153, 221, 268; 310/311, 313 R–313 D
See application file for complete search history.

(56) References Cited

U.S. PATENT DOCUMENTS

| | | | | |
|---|---|---|---|---|
| 5,047,187 | A * | 9/1991 | Banus | 264/71 |
| 5,297,553 | A * | 3/1994 | Sliwa et al. | 600/459 |
| 5,730,113 | A * | 3/1998 | Wildes et al. | 125/13.01 |
| 5,792,058 | A | 8/1998 | Lee et al. | |
| 6,088,894 | A | 7/2000 | Oakley et al. | |
| 6,483,225 | B1 | 11/2002 | Spigelmyer | |

FOREIGN PATENT DOCUMENTS

EP 0 685 985 12/1995

OTHER PUBLICATIONS

Safari et al., Solid freeform fabrication of piezoelectric sensors and actuators, Journal of Materials Science 41 (2006), pp. 177-198.*

(Continued)

*Primary Examiner* — Katarzyna Wyrozebski Lee
*Assistant Examiner* — Scott W Dodds
(74) *Attorney, Agent, or Firm* — Buchanan Ingersoll & Rooney PC

(57) ABSTRACT

A method of manufacturing a sonar projector is disclosed. The method comprises the steps of: bonding a flat piezo-ceramic plate to a flexible conducting sheet; dicing the plate to form an assembly comprising a matrix of piezo-ceramic pegs bonded to the flexible conducting sheet, the pegs being separated by kerfs; bending the assembly to a predetermined curvature, thereby expanding the kerfs; filling the expanded kerfs with a filler material; and applying conductive material to the exposed surfaces of the pegs, such that the conductive material and the flexible conducting sheet in combination form electrodes operable to apply a voltage to the piezo-ceramic pegs. Methods of manufacturing a curved piezo-ceramic structure are also disclosed.

14 Claims, 6 Drawing Sheets

OTHER PUBLICATIONS

Notification of Transmittal of the International Search Report and the Written Opinion of the International Searching Authority issued in corresponding International Application No. PCT/GB2008/050767 Forms (PCT/ISA/220, PCT/ISA/210 and PCT/ISA/237) dated Jun. 15, 2009.

"A New Technology Which is Taking the Sonar Industry by Storm", 3 pages, http://www.sonavision.co.uk/pdf/1_3_Composite_Introduction.pdf (cited on p. 1 of the specification).

Anonymous:, "Custom Design" Internet Article, (Online) Retrieved from the Internet: URL:http://www.chelsea.co.uk/marine%20Acoustices%20PDF%20Files/Custom%20Design/Custom%20design Jan08.pdf>, (retrieved on Jun. 16, 2008) XP002484380.

Anonymous:, "Piezocomposites Enhance Transducer Performance" Morgan Electro Ceramics Technical Articles, (Online) Retrieved from the Internet: URL:http://www.morganelectroceramics.com/articles/piezocomposites.htm>, (retrieved on Jun. 16, 2008) XP002484379.

Belcher et al., "An Application of Tapered, PZT Composite Lenses in an Acoustic Imaging Sonar with 1-CM Resolution" Oceans, MTS/IEEE Conference Proceedings Halifax, 1997, vol. 2, pp. 1043-1047, XP010246119.

European Search Report in Application No. 07270047.9-1240 dated Aug. 22, 2008.

Search Report in corresponding Application No. GB0717713.2 dated Dec. 12, 2007.

* cited by examiner

MANUFACTURE OF SONAR PROJECTORS

This invention concerns improvements relating to the manufacture of sonar projectors. The invention also concerns improvements relating to the manufacture of curved piezo-ceramic arrays used in sonar projectors.

Sonar is used in marine applications for surveying the underwater environment and for locating submerged objects. A sonar system requires both a sonar projector to project sound at a particular frequency, and a sonar receiver to detect sound at that particular frequency, such as may be reflected from submerged objects, or from a surface such as the sea bed. The properties of the sonar projector will depend on the particular application for which the sonar system is to be used. For some applications, it is necessary to manufacture a curved piezo-ceramic transducer. Such curved transducers are used for the purposes of broadening the beam width where the particular application for the projector constrains the size of the transducer, or requires that the projector must have a particular profile, for example for hydrodynamic reasons.

One particular application for such curved transducers is in the field of underwater mine neutralisation. A mine neutralising vehicle can be guided to the approximate area of a submerged mine by a mothership. Once in the approximate area of the submerged mine, the mine neutralising vehicle will be required to locate more precisely the submerged mine, for which it requires a sonar projector having a relatively broad field of view. In order to keep the nose of the vehicle sufficiently compact, whilst ensuring that such a broad field of view is achieved, it is necessary to provide a curved projector.

A known process of manufacturing such a curved projector is described in a document entitled "A New Technology which is taking the Sonar Industry by Storm" and available to be downloaded, at the time of filing, from http://www.sonavision co.uk/pdf/1_3_Composite_Introduction.pdf. The method comprises heat forming a linear projector around a section of curved backing material. The linear projector comprises a number of pillars of piezoelectric ceramic material (also referred to herein as piezo-ceramic) in a matrix of a polymer material, with electrodes formed on the top and bottom of the pillars by conductive epoxy. The piezo-ceramic forms the active part of the transducer, whilst the polymer material is a passive filler.

A number of problems have been identified with the above method. Whilst large radii of curvatures can be achieved (see, for example, FIG. 2 in the document referred to above), it is not possible to manufacture projectors with small radii of curvatures because of the strain that is exerted on the filling polymer during bending. Damage to the filling material during the bending process will degrade the performance of the projector. Moreover, it has been found that some damage can occur to the filling material even when only a small degree of curvature is desired.

It is an aim of the present invention to provide an improved method of manufacture of curved sonar projectors that overcomes, or at least partially mitigates, some of the above-mentioned problems. It is also an aim of the invention to provide an improved method of manufacture of curved piezo-ceramic structures. Curved piezo-ceramic structures may be used, for example, as the active element in curved sonar projectors.

In accordance with a first aspect of the invention, there is provided a method of manufacturing a sonar projector comprising the steps of:

(i) bonding a flat piezo-ceramic plate to a flexible conducting sheet;

(ii) dicing the plate to form an assembly comprising a matrix of piezo-ceramic pegs bonded to the flexible conducting sheet, the pegs being separated by kerfs;

(iii) bending the assembly to a predetermined curvature, thereby expanding the kerfs;

(iv) filling the expanded kerfs with a filler material; and (v) applying conductive material to the exposed surfaces of the pegs, such that the conductive material and the flexible conducting sheet in combination form electrodes operable to apply a voltage to the piezo-ceramic pegs.

By performing the step of bending the assembly before performing the step of filling the kerfs, the amount of strain placed on the filler material during the manufacturing process is reduced. In comparison to the prior known method referred to above, this reduces the likelihood of defects, such as cracks, occurring in the filler material. Such cracks are detrimental to the performance of the projector. The piezo-ceramic plate may be ground to a predetermined height prior to bonding to the flexible conducting sheet. The predetermined height is chosen such that the desired frequency of operation of the projector is achieved. The outer surfaces of the piezo-ceramic pegs may then be protected prior to filling the kerfs. Such protection, for example by means of covering the outer surfaces with self-adhesive tape, prevents contamination of those parts of the piezo-ceramic pegs that are to be connected to an electrode The step of dicing the piezo-ceramic plate may comprise using a cutting tool to cut through the thickness of the plate. Use of a cutting tool enables the step of dicing the plate to be carried out accurately. The cutting tool may have a width in the range 100 μm to 1 mm; preferably 300 μm to 500 μm; and more preferably 400 μm. Widths within this range have been found to result in good performance of the projector. In particular, a width of 400 μm has been found to work well for a projector operating at a frequency of 500 kHz.

The step of dicing the plate may further comprise trimming the flexible conducting sheet. Advantageously, this allows the assembly to be cut accurately to the desired size, and, moreover, obviates the need for alignment of the piezo-ceramic plate with the conductive sheet during the step of bonding the sheet to the plate. Furthermore, incorporating trimming of the flexible conducting sheet into the step of dicing the piezo-ceramic plate enables a number of the assemblies to be formed on one conducting sheet, and then separated as part of the manufacturing process. Thus the method is readily scaleable to larger-scale manufacturing.

Optionally, the step of filling the expanded kerfs comprises the steps of: filling the expanded kerfs with uncured filler material; curing the filler material; and grinding to remove excess filler material. Grinding at this stage removes excess filler material around the sides of the matrix of piezo-ceramic pegs.

The step of filling the expanded kerfs may comprise the application of vacuum conditions prior to curing the filler material. This helps prevent the formation of air gaps in the filler material, which may degrade the performance of the projector. The step of filling the expanded kerfs may further comprise vibrating the assembly. This further helps the prevention of the formation of air gaps in the filler material.

The dimensions of the piezo-ceramic pegs may be selected such that the projector is operable to emit a sonar signal having a frequency in the range 100 kHz to 2 MHz. It has been found that the method is particularly suited to sonar projectors operating at a frequency within this range. Sonar projectors operating in this frequency range are used in the fields of minehunting, fish-finding, and side-scan systems.

In accordance with a second aspect of the invention, there is provided a method of manufacturing a curved piezo-ceramic structure comprising the steps of:

(i) bonding a flat piezo-ceramic plate to a flexible sheet;

(ii) dicing the plate to form an assembly comprising a matrix of piezo-ceramic pegs bonded to the flexible sheet, the pegs being separated by kerfs;

(iii) bending the assembly to a predetermined curvature, thereby expanding the kerfs;

(iv) filling the expanded kerfs with a filler material.

In accordance with a third aspect of the invention, there is provided a method of manufacturing a curved piezo-ceramic structure comprising the steps of: bonding a flat piezo-ceramic plate to a flexible sheet; dicing the plate to form an assembly comprising a matrix of piezo-ceramic pegs bonded to the flexible sheet, the pegs being separated by kerfs, which kerfs extend through the full thickness of the piezo-ceramic plate; bending the assembly to a predetermined curvature; and filling the kerfs with a filler material. Surprisingly, the inventors of the present invention have discovered that it is possible to dice the plate to form kerfs that extend through the full thickness of the piezo-ceramic plate, to leave only independent piezo-ceramic pegs bonded to a flexible conducting sheet. Previously, it was thought that such a structure would not have sufficient strength to withstand subsequent steps of the manufacturing process, and so only a part of the thickness of the piezo-ceramic plate was diced. Filling would then be performed, and the remaining, uncut, continuous portion of the piezo-ceramic plate ground away once the filler material had been cured. These additional grinding steps are obviated by embodiments of the present invention, leading to a simpler manufacturing process.

Optionally, the step of filling the kerfs is performed after the step of bending the assembly. Advantageously, this results in less strain being imposed on the cured filler material during the manufacturing process, so that defects in the filler material are less likely to occur.

The above and further features of the invention are set forth with particularity in the appended claims and will be described hereinafter with reference to various exemplary embodiments and to the accompanying drawings in which:

Figure 1:
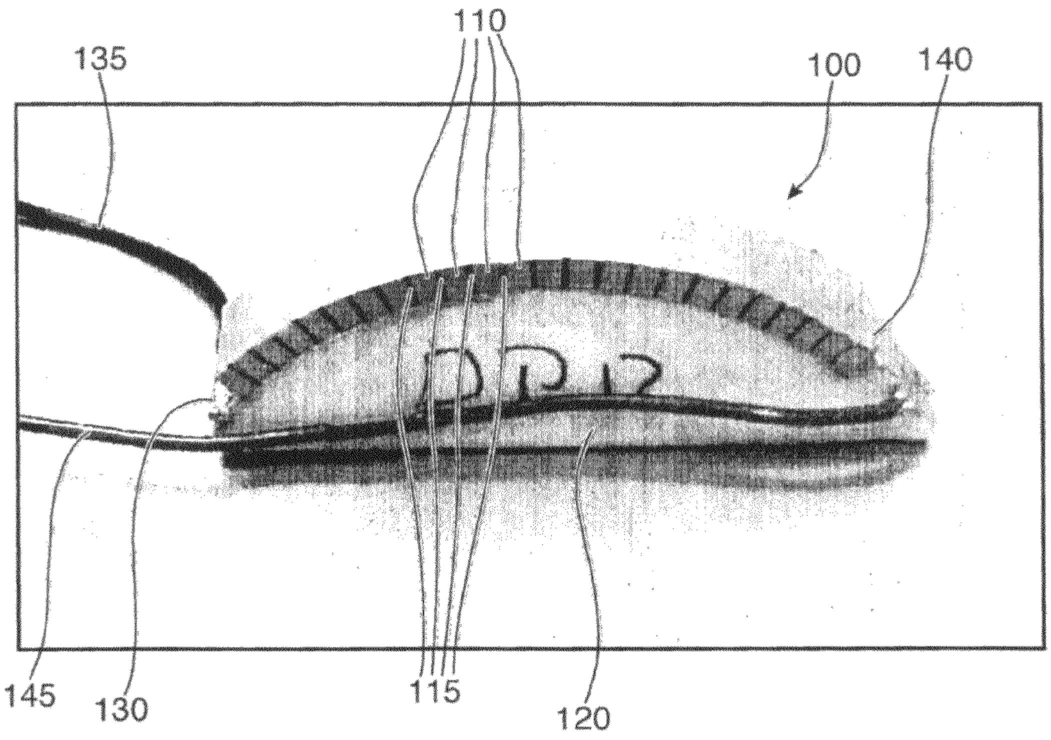
FIG. 1 is a photograph of a sonar projector manufactured using a method in accordance with an embodiment of the invention.

A photograph of a curved sonar projector 100 manufactured in accordance with a first embodiment of the invention is shown in FIG. 1. Projector 100 comprises a matrix of piezo-ceramic pegs, such as those labelled 110, on a former 120. The pegs 110 are separated by kerfs of width 400 μm, such as those labelled 115. The kerfs are filled by a filler material (not clearly visible in FIG. 1). In the embodiment shown in FIG. 1, the matrix of pegs 110 has twenty-four rows of four pegs of piezo-ceramic material. Each peg is 2.63 mm high, and has a cross-section of dimension 1.75 mm×1.4 mm. Between the matrix of pegs 110 and the former 120 is an electrode 130 that provides an electrical connection to the lower side of the piezo-ceramic pegs. Electrode 130 extends along the entire underside of the matrix of pegs 110, and, as shown in FIG. 1, extends beyond the matrix of pegs 110 to form a small tab of material to which an electrical connection can be made. A further electrode, labelled with reference numeral 140 in FIG. 1, provides an electrical connection to the upper side of the pegs 110. Wires 135 and 145 enable electrodes 130 and 140 respectively to be connected to a power amplifier (not shown), operable to apply a drive signal across the pegs 110 in order to activate the projector. For the present embodiment, which is designed to operate at a frequency of 500 kHz, the drive signal is a 500 kHz AC sinusoidal signal having a 720 V peak to peak amplitude. The piezo-ceramic pegs form the active material of the projector 100, whilst the ken-filler is a passive material.

Figure 2:
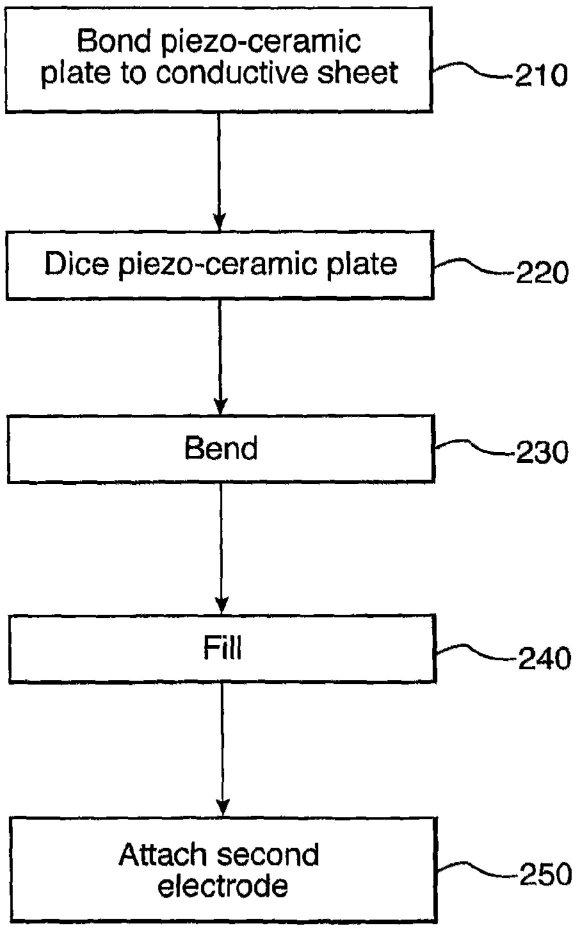
FIG. 2 is a flow diagram schematically illustrating a number of stages in the manufacture of embodiment of FIG. 1.

The method of manufacture of sonar projector 100 is illustrated in outline in the flow diagram shown in FIG. 2. Step 210 is the bonding of a flat piezo-ceramic plate to a flat, flexible conductive sheet. The piezo-ceramic plate forms the active material of the sonar projector, whilst the flexible conductive sheet is used to form a first electrode for the sonar projector. At step 220, the piezo-ceramic plate is diced. The dicing is performed using a dicing machine that cuts through the full thickness of the piezo-ceramic plate to create an assembly comprising a matrix of independent, separate pegs of piezo-ceramic material bonded to the flexible conductive sheet. The dicing step is also used to trim the piezo-electric plate and conductive sheet to the desired size. At step 230, the assembly is bent around a former block, and bonded thereto. The kerfs between the pegs are then filled at step 240. In both steps 230 and 240, care is taken to avoid the formation of air gaps, either between the conductive sheet and the former block, or within the kerf filler, since such air gaps may degrade the ultimate performance of the sonar projector. Finally, at step 250, a second electrode is formed on the exposed surface of the piezo-ceramic pegs through the application of conductive epoxy to this exposed surface.

Figure 3:
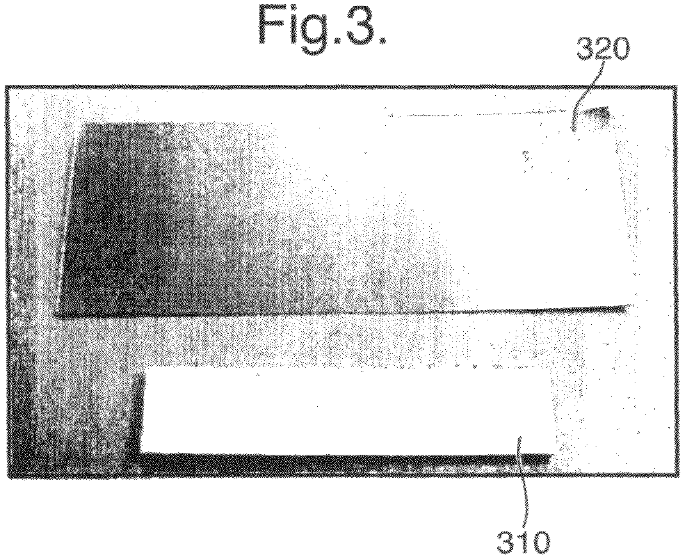
FIGS. 3 to 10 are photographs illustrating steps of a method in accordance with an embodiment of the invention.

FIGS. 3 to 10 illustrate stages in the manufacture of sonar projector 100. FIG. 3 shows the starting materials for the manufacture: a plate of piezo-ceramic material 310, and a flexible sheet 320 of conductive material that is to form the backing electrode for the transducer. In the present embodiment, the conductive material is a nickel-silver alloy. The piezo-ceramic material used in the present embodiment is lead zirconate titanate, $Pb(Zn_xTi_{1-x})O_3$ (or PZT) of type 5a, which is also known in the art as Navy Type II PZT. “Navy Type II” and 5a refer to a particular grade of PZT that is commonly used in the art for the fabrication of sonar projectors. The plate of piezo-ceramic material is pre-ground to an appropriate thickness, which thickness is determined by the frequency at which the sonar projector is to operate. In the present embodiment, the slab is ground to 2.63 mm±0.02 mm. The thickness of the slab determines the frequency of operation of the eventual projector, which, in the present embodiment, is 500 kHz.

Figure 4:
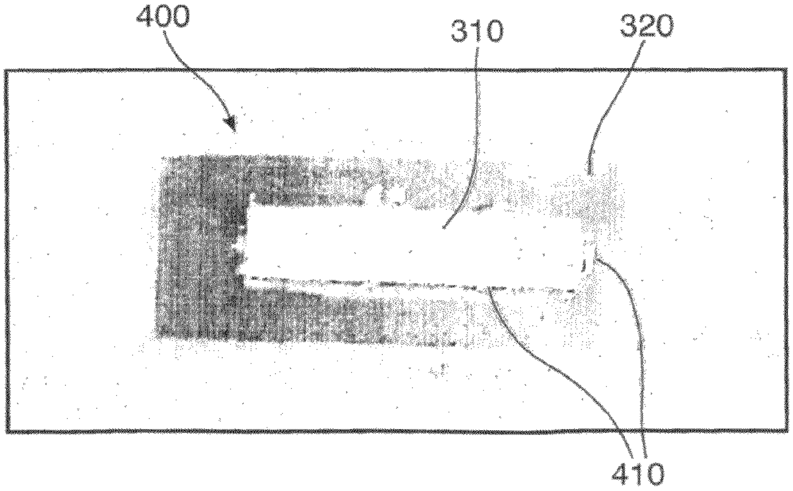

The first stage in the manufacture of projector 100 is the bonding of plate 310 to sheet 320. Conductive epoxy mixed with microspheres is used to effect the bond. In the present embodiment, the conductive epoxy used is Chemence SL65, a silver-loaded epoxy, and the microspheres used have a diameter of 0.13 mm. Approximately two grams of the conductive epoxy is applied to the negative side of the piezo-ceramic plate in order to form an appropriate bond between the plate 310 and the sheet 320. A uniform load is applied to the positive side of the plate 320 and the conductive epoxy is cured in an oven at 63° C. for twenty minutes. The application of the load, in combination with the use of microspheres, enables a uniform bond thickness to be achieved between the plate 310 and the sheet 320. The resulting structure 400 is shown in FIG. 4. Surplus epoxy 410 is visible around the boundary between the plate 310 and the sheet 320.

Figure 5:
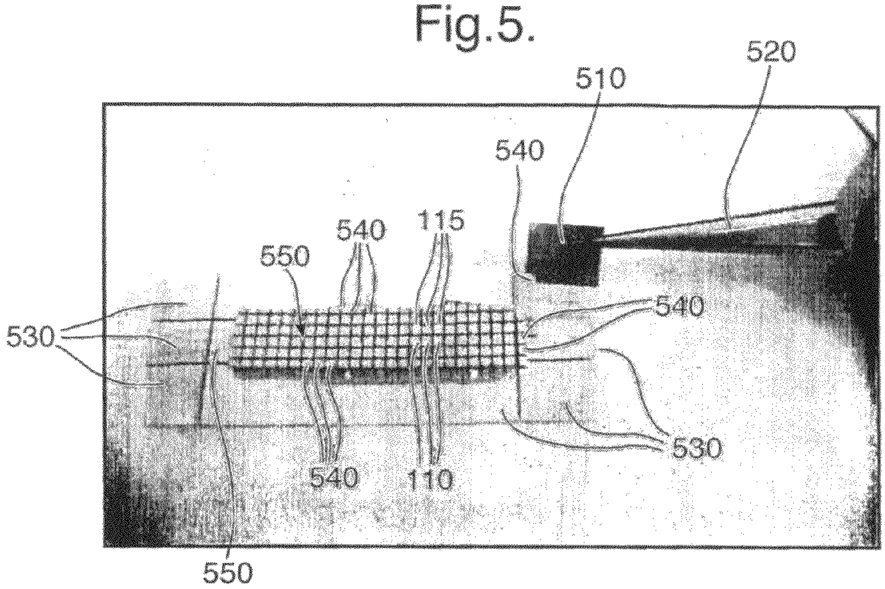

The second stage in the manufacture of projector 100 is the dicing of the piezo-ceramic plate 310 to form an assembly 500 comprising a matrix of piezo-ceramic pegs bonded to a conductive backing sheet, as shown in FIG. 5. Dicing is accomplished using a cutting tool. In the present embodiment, a 4" ProFortis ADT7100 dicing machine obtained from Advanced Dicing Technologies Ltd, Israel, is used. The dicing machine has a blade of width 400 μm that runs at 30000 rpm, and a resolution of 0.2 μm. It is configured to cut through the full thickness of the piezo-ceramic plate, resulting in a matrix of independent, regularly-spaced piezo-ceramic pegs, such as pegs 110, of square cross-section, which pegs are bonded to a backing sheet of conductive material, and separated by kerfs, such as kerfs 115. At the desired boundaries of the assembly 500, the dicing machine is configured to cut through both the full thickness of the piezo-ceramic plate, and the conductive sheet, such that excess material not forming part of the assembly 500 can be removed.

The removal of excess material enables pegs around the boundary of the plate, that may not be of the required dimensions, to be removed, and enables the resulting assembly to be of the correct overall size. Moreover, because excess areas of the flexible conducting sheet are removed at this stage, it is not necessary to precisely align the piezo-ceramic plate 310 with the flexible conducting sheet 320 during the first, bonding stage of the manufacturing process described above. Nor is it necessary to use, as a starting material, a piezo-ceramic plate of precisely defined dimensions: it is only necessary to ensure that the plate 320 is sufficiently large to manufacture at least one projector. In FIG. 5 excess material 510 of the flexible conducting sheet is shown being removed by tweezers 520. Sheet areas 530 are also to be removed in a similar manner. Parts of the piezo-ceramic material around the boundary of the diced piezo-ceramic plate are also to be removed. More particularly, the pegs along the three edges of the piezo-ceramic material including those pegs labelled with reference numeral 540 are to be removed, leaving a matrix of pegs, which matrix comprises twenty-four rows of pegs, each row comprising four pegs, as shown in FIG. 5. The matrix includes those pegs labelled with reference numeral 110. A small tab 550 of the conducting sheet is left at one end of the piezo-ceramic plate such that electrical contact can be made to the electrode on the underside of the matrix of piezo-ceramic pegs.

Figure 6:
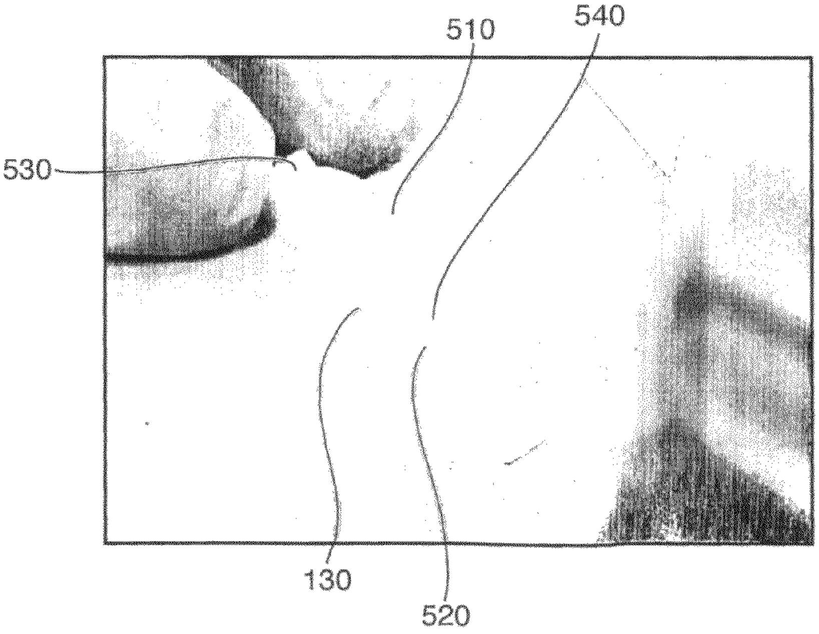

The third stage in the manufacture of projector 100 is the bending of the assembly 500. This is achieved by bonding assembly 500 to a former block 120 shown in FIGS. 1 and 6. It is made of a material selected for the purposes of impedance matching the sonar projector for the particular application for which the projector is intended. As is shown in FIG. 6, former 120 has a flat lower surface, a curved upper surface 610, and vertical sides 620. The assembly 500 is bonded to the curved upper surface 610, which thus defines the curvature of the assembly 500 in the resultant projector. The curved upper surface 610 is also provided with a step 630 at one side which is used to locate the assembly 500 on the former 120, and which also serves to provide a surface (not visible in FIG. 6) on which a connection to an upper electrode for the piezo-ceramic material can be made.

Figure 7:
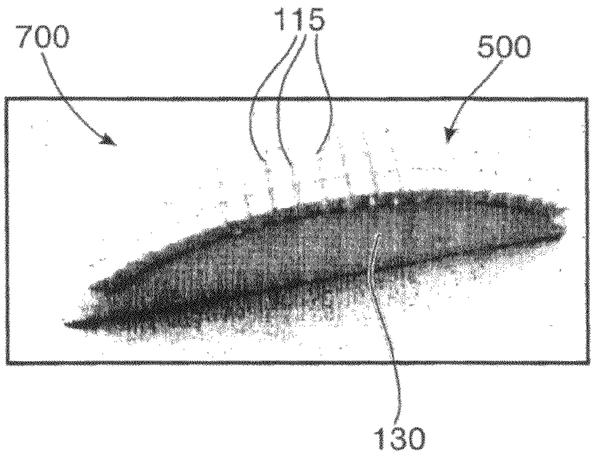

FIG. 6 illustrates the upper, curved surface of the former block 120, to which the backed matrix is to be attached, being coated with adhesive 640. Once the coating of adhesive 640 has been applied to the surface of the former block 120, the assembly 500 is attached to the block by hand, ensuring that the backed matrix follows the curvature of the block, and that no air gaps are present. The former 120 and assembly 500 are then held in place until a bond is achieved. In the present embodiment, the adhesive used is Loctite 222, for which it is necessary to hold the assembly 500 in place on the former block 120 for approximately 30 seconds in order to achieve a bond of appropriate strength. The resulting structure 700, comprising the assembly 500 bonded to the upper, curved surface 610 of the former block 120 is shown in FIG. 7. As can be seen from a comparison of FIG. 7 and FIG. 5, the kerfs 115 are in an expanded condition after the assembly 500 has been bent around the former block 120.

Figure 8:
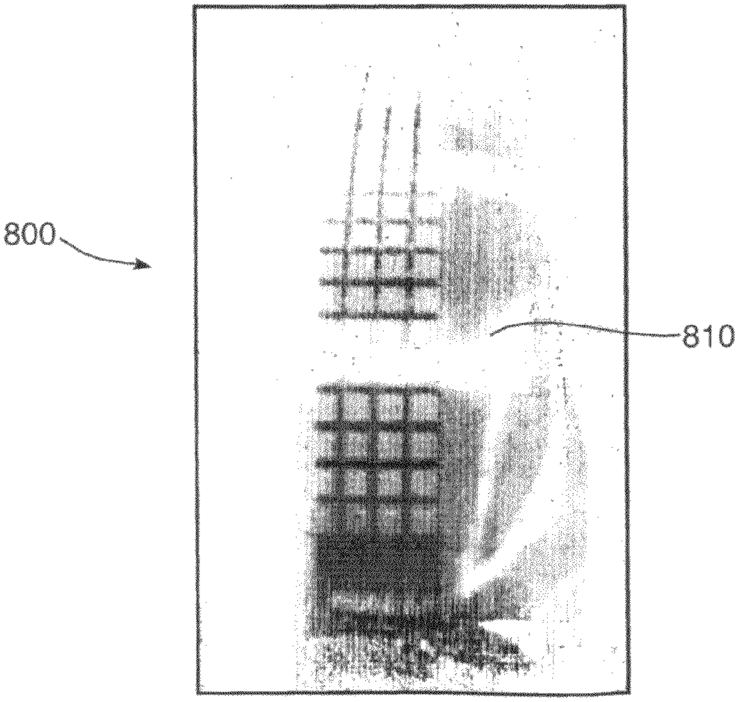
Figure 9:
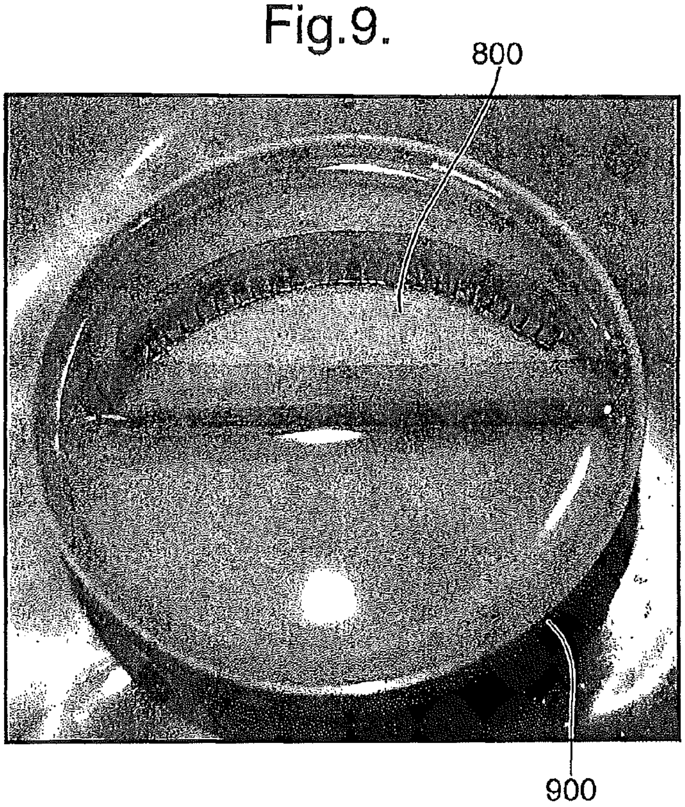

The fourth stage in the manufacture of the projector, after the bending of the diced piezo-ceramic plate, is the filling of the expanded kerfs 115 between the piezo-ceramic pegs 110. The kerf-filler used is a two part epoxy resin. In the present embodiment, 100 grams Vantico CY208 resin and 11 grams Vantico HY956 hardener are heated at 60° C. for two hours and then mixed together. The resulting mixture is de-gassed by placing it in a vacuum for two to three minutes. Prior to kerf-filling, the upper surfaces of the piezo-ceramic pegs covered by self-adhesive tape 810, as shown in FIG. 8, in order to prevent contamination of these surfaces during the ken-filling process. As is shown in FIG. 9, the protected structure 800 is then placed into a mould tool 900, and the mixed resin poured in. The mould tool serves to contain the resin during the curing process. The mould tool 900, holding the projector and resin, is placed in a Cast N' Vac machine, available from Buehler, a company whose address is Buehler Ltd, 41 Waukegan Road, Lake Bluff, Ill. 60044, USA. The Cast N' Vac machine is a vacuum casting machine that is used to hold the mould tool, projector and resin under vacuum for a further two to three minutes before being removed. The Cast N' Vac machine also applies a small amount of vibration to the mould tool, projector and resin, which results from the operation of the motor of the vacuum pump that is integral within the machine. This vibration assists in preventing the formation of air gaps within the resin between the piezo-ceramic pegs of the projector. The resin is then cured at 60° C. for 24 hours, after which the projector is removed from the mould, and the protecting self-adhesive tape 810 removed.

The de-gassing of the resin mixture, and the application of a vacuum to the mould tool once the resin has been poured over the projector, is necessary in order to ensure that no air gaps, or other gas bubbles, form in the resin. Such gaps can significantly degrade the performance of the resulting projector.

Figure 10:
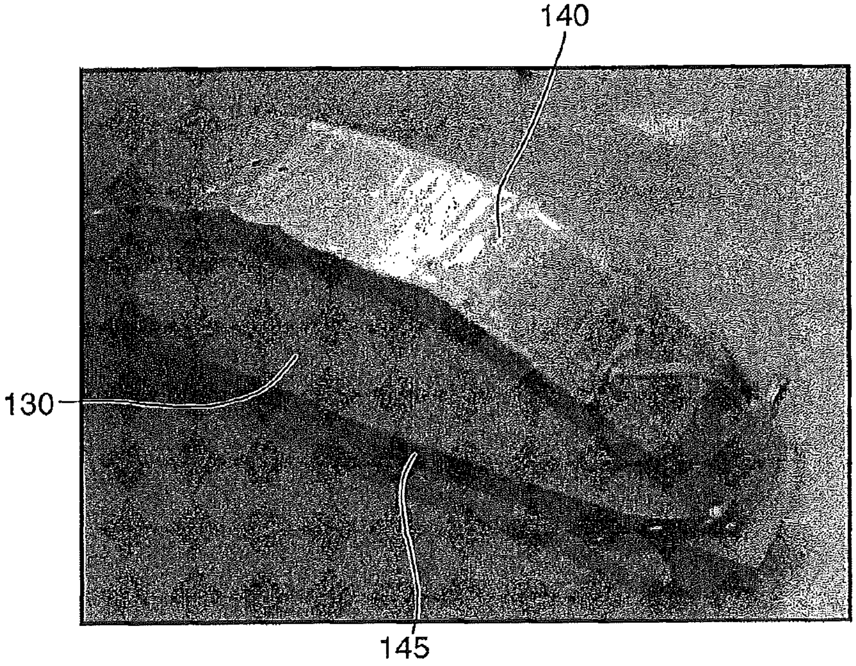

The final stage in the manufacture of the projector is the attachment of the upper electrode to the matrix of piezo-ceramic pegs, and the attachment of electrical connection wires to the electrodes. As is shown in FIG. 10, the upper electrode 140 is formed by the application of a layer of conductive epoxy to the exposed upper surfaces of the piezo-ceramic pegs. The epoxy is applied with care to ensure that no direct connection is formed between the upper and lower electrodes. Such a connection may short-circuit the piezo-ceramic material. The conductive epoxy is also used to bond a wire 145 for later electrical connection to the upper electrode to the raised pad on the former block 120. The conductive epoxy is then cured at 60° C. for twenty minutes. Wire 145 is then positioned to run along one of the vertical sides of the former 120, and held in place using a small amount of Dymax 910 adhesive, a high viscosity acrylic resin, which also serves to provide some strain relief for the wire 145. The adhesive is cured by exposure to UV light using a Dymax UV light generator. Finally, a second electrical connection wire (not shown in FIG. 10) is soldered to the exposed portion of the lower electrode at the opposite end of the former block 120. This final stage results in the projector 100 shown in FIG. 1.

Having described the invention with reference to one specific embodiment of the invention, it is to be noted that the above-described embodiment is in all respects exemplary.

Variations and modifications to the above embodiment are possible without departing from the scope of the invention, which is defined in the accompanying claims. Such variations and modifications will be immediately obvious to those skilled in the art. For example, it is to be noted that, whilst, in the above, it has been described to grind the piezo-ceramic plate prior to its bonding to the flexible conductive sheet, it is possible to perform the grinding step at any point prior to the step of dicing the piezo-ceramic plate. Moreover, whilst, in the above, it has been described to use a former block that is intended to become the backing block for the projector, those skilled in the art will immediately appreciate that it will also be possible to use a dedicated former to create the curvature in the matrix of piezo-ceramic pegs, and attach the backed matrix of pegs to the intended backing block at a later stage in the manufacture of the projector. It may be desirable to use such a dedicated former block, for example, where it is necessary to use a material for the backing block that is not able to withstand the conditions imposed during the kerf-filling process. Those skilled in the art will also appreciate that many other methods may be used for the formation of the upper electrode for the projector: for example, a further conductive sheet of material could be bonded to the upper, exposed surface of the piezo-ceramic pegs using a conductive epoxy. Furthermore, those skilled in the art will appreciate that, whilst specific examples of materials have been given in above description, the inventive concept will be applicable to the manufacture of curved projectors using any piezo-ceramic material for the ultrasound transducer. Moreover, many other equivalent adhesives may be used in the manufacture of the projector.

Finally, it is noted that it is to be clearly understood that any feature described above in relation to any one embodiment may be used alone, or in combination with other features described, and may also be used in combination with one or more features of any other of the embodiments, or any combination of any other of the embodiments.

The invention claimed is:

1. A method of manufacturing an underwater sonar projector comprising the steps of:

(i) bonding a flat piezo-ceramic plate to a flexible conducting sheet;

(ii) dicing the plate, by cutting through the thickness of the plate with a cutting tool having a width in the range of 300 μm to 500 μm to form an assembly comprising a matrix of rows of piezo-ceramic pegs bonded to the flexible conducting sheet, the pegs being separated by kerfs;

(iii) bending the assembly to a predetermined curvature, thereby expanding the kerfs;

(iv) filling the expanded kerfs with a filler material; and (v) applying conductive material to the exposed surfaces of the pegs, such that the conductive material and the flexible conducting sheet in combination form electrodes operable to apply a voltage to the piezo-ceramic pegs.

2. A method as claimed in claim 1, wherein the step of dicing the plate further comprises using the cutting tool to trim the flexible conducting sheet.

3. A method as claimed in claim 1, wherein the step of filling the expanded kerfs comprises the steps of: loading the expanded kerf with uncured filler material; curing the filler material; and grinding to remove excess filler material.

4. A method as claimed in claim 3, wherein the step of filling the expanded kerfs comprises the application of vacuum conditions prior to curing the filler material.

5. A method as claimed in claim 3, wherein the step of filling the expanded kerfs comprises vibrating the assembly.

6. A method as claimed in claim 1, wherein the step of dicing the plate further comprises using the cutting tool to trim the flexible conducting sheet.

7. A method as claimed in claim 2, wherein the step of filling the expanded kerfs comprises the steps of: loading the expanded kerf with uncured filler material; curing the filler material; and grinding to remove excess filler material.

8. A method as claimed in claim 4, wherein the step of filling the expanded kerfs comprises vibrating the assembly.

9. A method as claimed in claim 2, wherein the step of using the cutting tool to trim the flexible conducting sheet further comprises removing pegs around the boundary of the plate.

10. A method as claimed in claim 6, wherein the step of using the cutting tool to trim the flexible conducting sheet further comprises removing pegs around the boundary of the plate.

11. A method as claimed in claim 1 wherein the step of dicing the plate further comprises cutting through the flexible conductive sheet with the cutting tool to form a number of said assemblies.

12. A method of manufacturing a curved piezo-ceramic structure for use in an underwater sonar projector, the method comprising the steps of:

a) bonding a flat piezo-ceramic plate to a flexible conducting sheet;

b) dicing the plate with a cutting tool having a width in a range of 300 μm to 500 μm to form an assembly comprising a matrix of rows of piezo-ceramic pegs bonded to the flexible conductive sheet, the pegs being separated by kerfs, which kerfs extend through the full thickness of the piezo-ceramic plate;

c) bending the assembly to a predetermined curvature; and d) filling the kerfs of the bent assembly with a filler material.

13. A method as claimed in claim 12, wherein the step of filling the kerfs is performed after the step of bending the assembly.

14. A method as claimed in claim 12 wherein the step of dicing the plate further comprises cutting through the flexible conductive sheet with the cutting tool to form a number of said assemblies.

* * * * *